United States Patent [19]
Asakawa

[11] Patent Number: 5,525,928
[45] Date of Patent: Jun. 11, 1996

[54] FILTER BOOST PREATTENUATOR

[75] Inventor: Gary J. Asakawa, Colorado Springs, Colo.

[73] Assignee: Silicon Systems, Inc., Tustin, Calif.

[21] Appl. No.: 394,749

[22] Filed: Feb. 27, 1995

[51] Int. Cl.$^6$ ............................................. H04B 1/10
[52] U.S. Cl. ................ 327/552; 327/553; 327/316; 327/323; 327/361
[58] Field of Search ........................... 327/316, 553, 327/559, 361, 365, 552, 363, 323, 311, 358

[56] References Cited

U.S. PATENT DOCUMENTS

| | | | |
|---|---|---|---|
| 2,860,241 | 11/1958 | Post | 327/358 |
| 4,599,572 | 7/1986 | Nakayama | 327/361 |
| 4,743,783 | 5/1988 | Isbell et al. | 327/361 |
| 4,780,630 | 10/1988 | Corpechot et al. | 327/361 |

OTHER PUBLICATIONS

Nise, "Control Systems Engineering", 1992 p. 13 and Fig. 13. 18.

*Primary Examiner*—Timothy P. Callahan
*Assistant Examiner*—Jung Ho Kim
*Attorney, Agent, or Firm*—Hecker & Harriman

[57] ABSTRACT

A filter boost preattenuator provides controlled, rapid variable signal preattenuation at the input of a filter to optimally compensate for the absolute gain increase of the filter caused by increasing the high frequency boost level of the filter. The amplitude of the filter output exhibits very little change during boost variations that dynamically occur in applications such as data and servo signal recovery in disk drives. Using the present invention, disk space overhead needed to allow for readjustment of the automatic gain control system of a read/write channel is minimized. In the present invention, the feedforward signal provided from the variable gain boost circuit is applied to a feedback circuit and subtracted from the system input. The feedback forces a drop in the overall gain of the filter that increases with boost gain. Therefore, when the boost gain value is raised, as occurs when a read channel transitions between "data" and "servo" modes in a disk drive, the overall gain of the filter decreases to compensate, reducing the performance load on the automatic gain control circuitry.

36 Claims, 5 Drawing Sheets

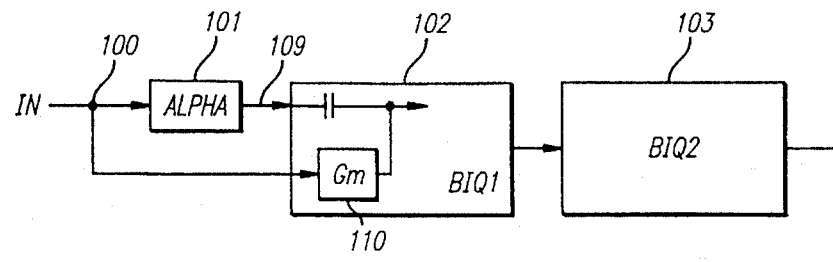
FIG. 1 PRIOR ART
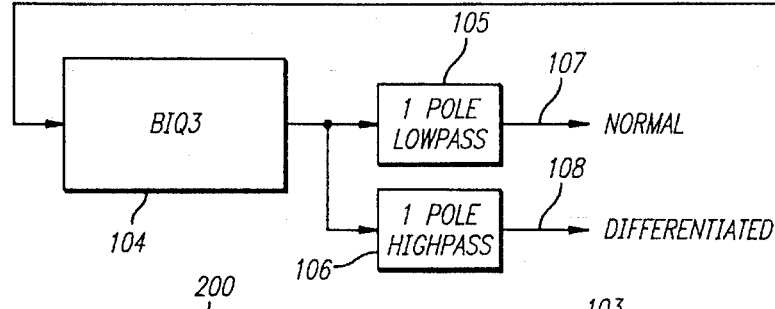
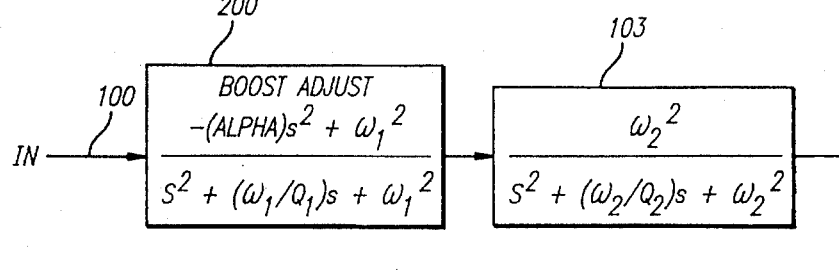
FIG. 2 PRIOR ART
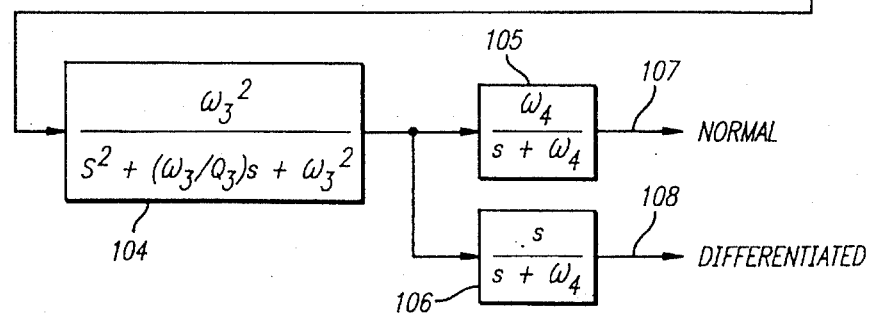
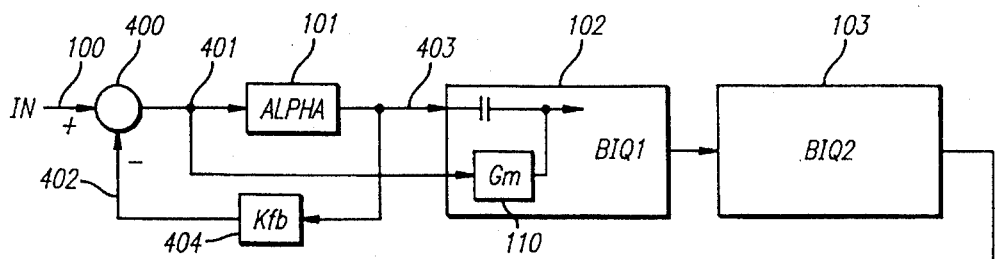
FIG. 4
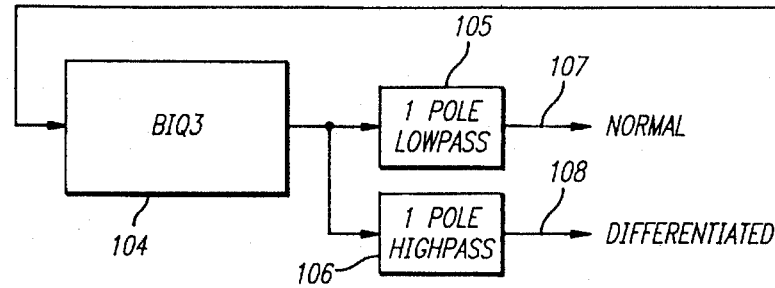

FILTER BOOST PREATTENUATOR

BACKGROUND OF THE INVENTION

1. Field of the Invention

This invention relates to the field of analog circuits, and, in particular, to continuous-time filters.

2. Background Art

Seven pole electronic filters with variable high frequency boost are widely used in zoned bit signal processing channels of hard disk drives to optimize the cutoff frequency (Fc) and boost for variable data transfer rates. The high frequency boost serves to slim incoming data pulses to reduce intersymbol interference.

Typical seven pole filters, such as that shown in FIG. 1, consist of three biquadratic filter sections, or "biquads," followed by a single order output section. A feedforward section in front of the first biquad provides the pulse-slimming function. An example of a biquad element with feedforward boost is discussed with respect to FIG. 9 below.

In FIG. 1, input signal IN 100 is provided to the filter input of the first biquad element, BIQ1 102. The filter input stage of the biquad is commonly a transconductance stage, represented by block 110 labeled "Gm" in FIG. 1. Input signal IN 100 is also provided to feedforward amplifier 101 to provide a programmable gain ALPHA for feedforward signal 109.

Feedforward signal 109 is provided to BIQ1 102 where signal 109 is AC coupled to a summing node to provide high frequency boost to the filter signal containing the input signal 100 component. The output of BIQ1 102 is coupled to the input of the second biquad element, BIQ2 103, and the output of BIQ2 103 is coupled to the input of the third biquad element, BIQ3 104. The output of BIQ3 104 is coupled to single-pole lowpass output section 105 and single-pole highpass output section 106. Standard or "normal" filter output 107 is provided by section 105. Differentiated filter output 108 is provided by section 106.

Each "BIQ" block in FIG. 1 is a 2nd order "Biquad" circuit with electronically variable cutoff frequency Fc controlled by a digital-to-analog converter (DAC). In the normalized transfer function of the biquad circuit, the cutoff frequency is assumed to be 1 radian/second or ½π hertz. This function can be denormalized for actual cutoff frequencies by replacing the complex frequency variable "s" with s/2πFc where Fc is in hertz. The high frequency boost is increased by increasing the boost value ALPHA in the feedforward section, which is typically in the range between zero and five.

FIG. 2 is a block diagram showing the transfer functions of the respective sections of the seven pole filter. Sections 101 and 102 are combined into Boost Adjust section 200 with a biquadratic transfer function of:

$$H(s) = \frac{-(ALPHA)s^2 + \omega_1^2}{s^2 + (\omega_1/Q_1)s + \omega_1^2} \quad [1]$$

where $\omega_1$ and $Q_1$ are the cutoff frequency and quality factor of the first biquad BIQ1 102. ALPHA is the gain of the feedforward amplifier 101. Biquad sections 103 and 104 provide the transfer functions of:

$$H(s) = \frac{\omega_k^2}{s^2 + (\omega_k/Q_k)s + \omega_k^2} \quad [2]$$

where k=2 for BIQ2 and k=3 for BIQ3. Section 105 provides a lowpass transfer function of:

$$H(s) = \frac{\omega_4}{s + \omega_4} \quad [3]$$

and section 106 provides a highpass transfer function of:

$$H(s) = \frac{s}{s + \omega_4} \quad [4]$$

The transfer function provided by the entire seven pole filter is obtained by multiplying the transfer functions of equations 1–3, or 1–2 and 4, as appropriate for the filter sections involved, into a single seventh-order expression.

FIG. 9 illustrates one biquad implementation including a feedforward boost function. Other biquad circuits exist, such as non-differential and/or resistive RC implementations. FIG. 9 is a circuit block diagram of a differential biquad circuit of transconductance amplifiers and capacitors. The cutoff frequency of the circuit is determined by the gm/C values within the main feedback loop (elements C1–C4, 904 and 907). Element 101 is the feedforward amplifier with gain of α (ALPHA). The "Gm" element 110 in biquad 102 of FIG. 1 corresponds to transconductance amplifier 902. The AC coupling capacitor in biquad 102 corresponds to capacitors C3 and C4.

Input signal IN 100, in differential form, is provided to the input ports of transconductance amplifier 902 and feedforward amplifier 101. The positive and negative output ports of transconductance amplifier 902 are coupled through capacitors C1 and C2, respectively, to stable reference voltage 900. Further, the positive and negative output ports of transconductance amplifier 902 are coupled to the positive and negative input ports of buffer 903, as well as the negative and positive output ports, respectively, of transconductance amplifier 907. The positive and negative output ports of buffer 903 are coupled to the positive and negative input ports of transconductance amplifier 904. Buffers 903 and 905 are utilized for level-shifting and biasing purposes.

The positive and negative output ports of feedforward amplifier 101 provide feedforward signal 109. The positive output port of feedforward amplifier 101 is coupled through capacitor C4 to the negative input port of buffer 905. The negative output port of transconductance amplifier 904 and the positive output port of transconductance amplifier 906 are also coupled to the negative input port of buffer 905. The negative output port of feedforward amplifier 101 is coupled through capacitor C3 to the positive input port of buffer 905.

The positive output port of transconductance amplifier 904 and the negative output port of transconductance amplifier 906 are also coupled to the positive input port of buffer 905. The input port of buffer 905 is the summing node where AC coupled feedforward signal 109 is internally summed with the filter signal. The positive and negative output ports of buffer 905 are coupled to the positive and negative input ports of transconductance amplifiers 906 and 907. The lowpass output of the biquad is taken across the positive and negative output ports of buffer 905 (marked as Vlp+ and Vlp–).

If capacitors C1–C4 are chosen to have the same value, the frequency response of the biquad of FIG. 9 is given by the following equation:

$$H(s) = \frac{gm1gm3 - s^2\alpha C^2}{s^2C^2 + sCgm2 + gm1gm3} \quad [5]$$

where $$\omega_0 = \frac{\sqrt{gm1gm3}}{C} \quad [6]$$

-continued $$Q = \frac{\sqrt{gm1 \, gm3}}{gm2} \quad [7]$$

The transconductance values of transconductance amplifiers 902, 903, 906 and 907 are gm1, gm3, gm2 and gm1, respectively.

A disadvantage of the electronic filters of the prior art is that as boost (ALPHA) is increased, the absolute gain of the filter for all frequencies beyond DC, and especially higher frequencies in the vicinity of the cutoff frequency, increases significantly. Rapid boost changes typically occur for electronic filters used in read/write channels of sector servo disk drives when changing a read/write channel from "data" mode to "servo" mode. The increase in gain must be compensated by an automatic gain control loop (AGC) as well as any DC offset restoring circuits in the channel. The result is an increase in overhead time and disk space required for the transients to settle out. Disk drive performance is degraded due to the limitations imposed on data storage density and data access time. Furthermore, the gain shift artificially consumes a large portion of the dynamic range of the AGC that could otherwise be used to regulate additional head/disk signal variations.

FIG. 3 shows a family of boost magnitude response curves with Fc of 22 MHz. For this figure, the components of the normalized transfer function are:

$$\omega_1^2 = 1.31703 \quad \omega_1/Q_1 = 1.68495$$
$$\omega_2^2 = 2.95139 \quad \omega_2/Q_2 = 1.54203$$
$$\omega_3^2 = 5.37034 \quad \omega_3/Q_3 = 1.14558$$
$$\omega_4 = 0.86133$$

Curves are plotted for ALPHA=0, 1, 3 and 5. For the normalized curves, the DC value is 0 dB. As shown, for increasing ALPHA, the high frequency gain rises rapidly above 0 dB. For ALPHA=5, the gain boost reaches 13 dB. While compensating for intersymbol interference, the large increase in high frequency gain places unwanted demands on the AGC. Thus, in the prior art, the AGC must account for the large gain shift during events such as the switching of a read channel between "data" and "servo" modes.

SUMMARY OF THE INVENTION

The present invention is a method and apparatus for providing filter boost preattenuation. The present invention applies controlled, rapid variable signal preattenuation at the input of a filter to optimally compensate for the absolute gain increase of the rest of the filter caused by increasing the high frequency boost level of the filter. The amplitude of the filter output changes very little during boost changes that dynamically occur in applications such as data and servo signal recovery in disk drives. By using the present invention in such disk drive applications, disk space overhead needed to allow for readjustment of the automatic gain control system of the channel is minimized.

In the present invention, a feedforward signal provided from a variable gain boost circuit is applied to a feedback circuit and subtracted from the system input. The feedback causes a drop in the overall gain of the filter that increases with boost gain. Therefore, when the boost gain value is raised, as occurs when a read channel transitions between "data" and "servo" mode, the overall gain of the filter drops to compensate, reducing the performance load on the automatic gain control circuitry.

In one embodiment of the present invention, the summing/subtraction circuit and the feedback gain are provided by two differential-pair based amplifiers. The first differential pair of transistors receives the system input and the second differential pair of transistors receives the feedforward signal from the boost block. The outputs of both differential pairs are coupled together in opposing polarity to perform the summing/subtraction function and the summed output is provided to the boost block and to the filter circuit. Emitter resistors and collector load resistors determine the gain for the feedback circuit. By applying the negative feedback, the system input is preattenuated prior to filtering based on the booster gain value. The performance load placed on the AGC is diminished and AGC dynamic range is conserved. Further, when used in a disk drive, response time is diminished and disk storage space utilization is optimized.

BRIEF DESCRIPTION OF THE DRAWINGS

FIG. 1 is a block diagram of a prior art seven pole filter with high frequency boost.

FIG. 2 is a block diagram of the prior art filter circuit showing the transfer functions provided by each filter section.

FIG. 4 is a block diagram of a seven pole filter incorporating an embodiment of the filter boost preattenuator of the present invention.

DETAILED DESCRIPTION OF THE INVENTION

Figure 3:
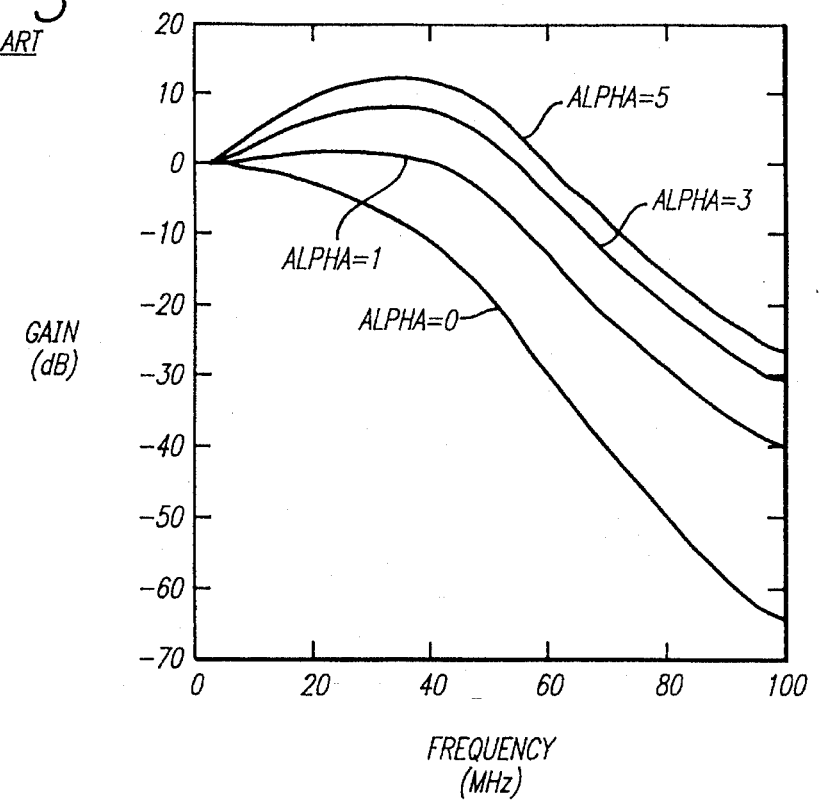
FIG. 3 illustrates a family of boost magnitude response curves for the boost function provided by the prior art.

The present invention is a method and apparatus for providing filter boost preattenuation. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

The present invention provides variable gain compensation preceding a filter. The compensation provided by the present invention produces a controlled and substantially instantaneous preattenuation of the signal at the filter input. This preattenuation compensates for an increase in gain resulting from filter boost, thereby maintaining stable gain over the bulk of the input signal spectrum. As a result, the "pivot point" of the boost magnitude response family of curves is moved toward the center of the pass band. Relatively constant absolute gain, regardless of boost, is maintained for the boosted signal whose spectrum is centered around the pivot point. Amplitude/offset transients in the channel during a boost change are essentially eliminated, and the usable dynamic range of the AGC is significantly increased.

The present invention samples the feedforward signal prior to the highpass coupling element and applies a scaled value of the feedforward signal to the system input as negative feedback. The overall system gain is thereby reduced across all frequencies by a boost dependent value, shifting the "pivot point" of the response towards DC as boost is increased. FIG. 4 shows how the present invention is applied to the prior art filter circuit of FIG. 2. The invention is applicable to any filter incorporating feedforward boost of a selected range of frequencies. FIG. 4 is merely an example of one possible implementation of the present invention.

In FIG. 4, system input signal 100 is provided to the positive input of summing circuit 400 rather than directly to amplifier 101 as was done in the prior art system of FIG. 2. The output of summing circuit 400, summed signal 401, is provided to the input of boost amplifier 101 and the transconductance input of biquad BIQ1 102. Kfb feedback amplifier 404 taps feedforward signal 403 and provides a scaled output, signal 402, to an inverted input of summing circuit 400 such that a subtraction function is provided. Feedforward signal 403 is AC coupled to a summing node in BIQ1 102, as described with respect to FIG. 2. BIQ1 102 and the following filter blocks are also coupled as in FIG. 2.

In the implementation of the preattenuator of the present invention shown in FIG. 4, the output of the preexisting feedforward amplifier of the prior art is shared with the boost preattenuator circuit made up of Kfb feedback amplifier 404, summing circuit 400, and feedforward amplifier 101. In an alternate embodiment, rather than sharing the feedforward amplifier, a separate boost amplifier dedicated to the feedback loop is provided.

Figure 5:
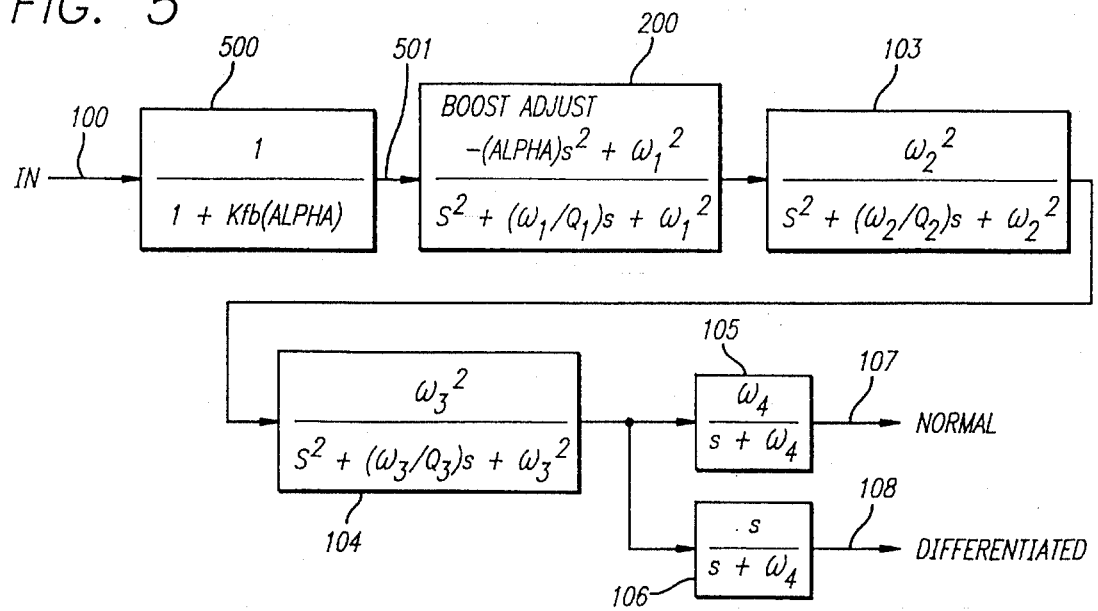
FIG. 5 is a block diagram showing the transfer functions provided by the seven pole filter implementing the filter boost preattenuator of the present invention.

FIG. 5 is a block diagram of the apparatus shown in FIG. 4 showing the transfer functions provided by each filter subsection and the boost preattenuator in one embodiment of the invention. The boost preattenuator 500 is shown at the front end of the system. Preattenuator 500 receives system input signal 100 and attenuates the signal substantially independent of frequency. The preattenuated signal 501 is passed to Boost Adjust block 200, which is cascaded with biquad sections 103 and 104, and the subsequent single-pole sections 105 and 106 as in the embodiment of FIG. 2. As shown in FIG. 5, the function provided by the boost preattenuator in this embodiment is:

$$H(s) = \frac{1}{1 + Kfb(ALPHA)} \quad [8]$$

where Kfb is the feedback gain and ALPHA is the feedforward gain. ALPHA typically varies from 0 to 5.

The feedback gain factor Kfb determines the "pivot point" Fp of the boost magnitude response family as follows:

$$Fp(\text{hertz}) = \sqrt{\omega_1^2 Kfb(Fc)^2} \quad [9]$$

Figure 6:
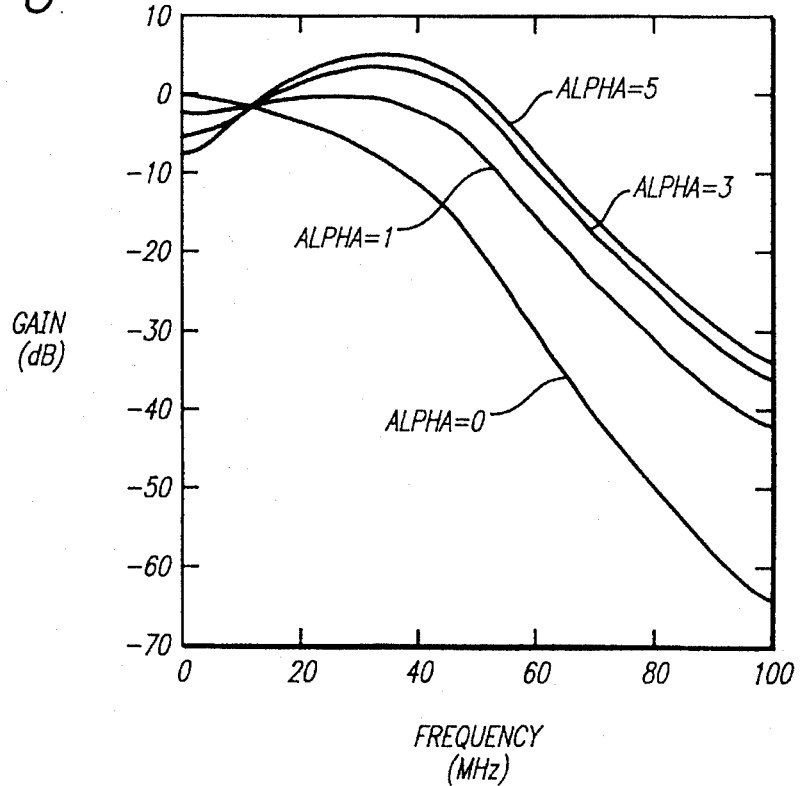
FIG. 6 illustrates a family of boost magnitude response curves for the filter boost preattenuator of the present invention.

FIG. 6 illustrates a family of boost magnitude response curves for the filter boost preattenuator of the present invention. In FIG. 6, Fc is set for 22 MHz and Kfb is set for 0.25, though Kfb may be greater than or less than 0.25 depending on the application. This is a typical value of Kfb for many disk drive read/write channels. For ALPHA=0, the curve shows no high frequency boost or preattenuation. For ALPHA=1, the frequency response curve is attenuated roughly 2 dB by the preattenuator to compensate for the high frequency boost. For ALPHA=3, the preattenuator compensates by attenuating the signal nearly 5 dB. Finally, for ALPHA=5, where the high frequency boost is roughly 13 dB above the DC value, the preattenuator attenuates the response curve by roughly 7 dB to balance the response profile, reducing the peak boost gain to approximately 6 dB above the zero boost DC value.

The present invention, when used in a read/write channel of a disk drive, increases the usable dynamic range of the automatic gain control (AGC) system of the read channel by up to a factor of three or more by essentially eliminating the gain shift of the filter as boost is varied. In prior art filters, the gain shift consumes a large portion of the AGC range. The present invention allows the channel to accommodate a much greater range of head/disk amplitude specifications. If filter boost change is involved, the invention significantly speeds up channel mode change transient times by maintaining much more consistent filter gain regardless of boost. Up to three or more microseconds per data sector of transient recovery overhead time can be eliminated. This time period represents additional disk space that may be released for data storage.

The filter boost preattenuator of the present invention allows read/write combo chips used in disk drives, as well as single piece dedicated filter chips, to increase disk capacity and performance and head/disk economy at essentially no additional chip cost. Depending on the embodiment, the present invention can be implemented by adding a small number of additional transistors to a chip. The generation and summing of the Kfb amplifier output to the input of the system as depicted in FIG. 4 can be accomplished, for example, with a simple "wired collector" bipolar transistor circuit design, as shown in FIG. 7.

Figure 7:
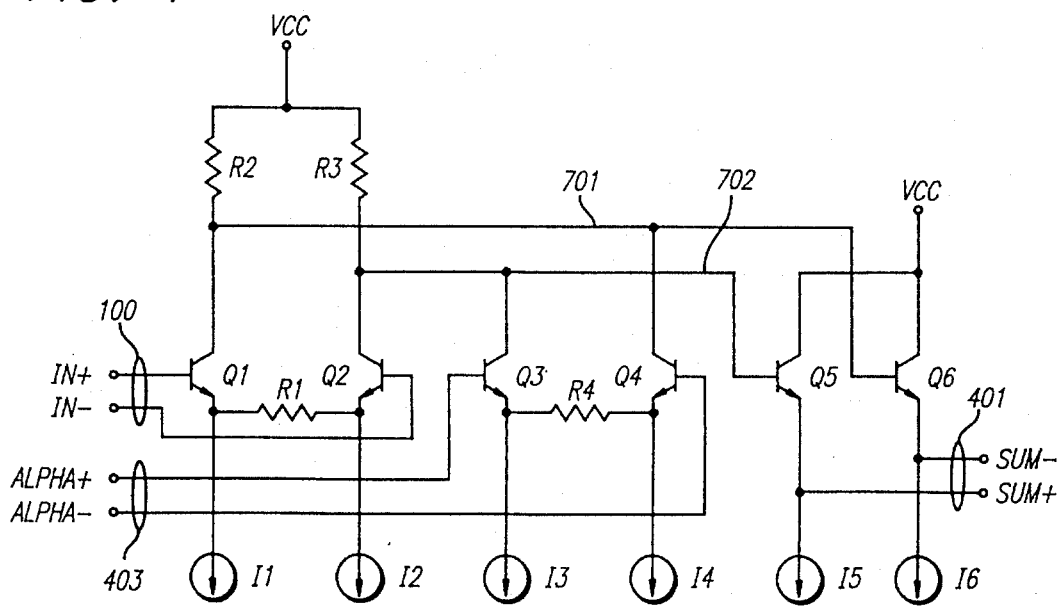
FIG. 7 is a circuit diagram of an embodiment of the feedback circuit used to implement the filter boost preattenuator of the present invention.

In FIG. 7, system input 100 comprises IN+ and IN− signals coupled to the base junctions of transistors Q1 and Q2, respectively. Feedforward signal 403 comprises ALPHA+ and ALPHA− signals coupled to the base junctions of transistors Q3 and Q4, respectively. The summed signal 401 comprises SUM+ and SUM− signals coupled to the emitter junctions of transistors Q5 and Q6, respectively.

Resistor R1 is coupled between the emitter junctions of transistors Q1 and Q2. The emitter junctions of transistors Q1 and Q2 are further coupled to current sources I1 and I2, respectively. Resistor R4 is coupled between the emitter junctions of transistors Q3 and Q4. The emitter junctions of transistors Q3 and Q4 are further coupled to current sources I3 and I4, respectively. The emitter junctions of transistors Q5 and Q6 are coupled to current sources I5 and I6, respectively. The collector junctions of transistors Q1 and Q4, and the base junction of transistor Q6, are coupled to node 701. Node 701 is further coupled through resistor R2 to a power supply voltage VCC. The collector junctions of transistors Q2 and Q3, and the base junction of transistor Q5, are coupled to node 702. Node 702 is further coupled through resistor R3 to VCC. The collector junctions of transistors Q5 and Q6 are coupled to VCC.

In FIG. 7, IN+/− 100 is the differential input to the filter system, and ALPHA±403 is the output of feedforward amplifier 101 of FIG. 4. The ALPHA signal is attenuated by the ratio of R2+R3 to R4, which is actually the gain of Kfb feedback amplifier 404 of FIG. 4, and summed with the filter input signal by connecting the collector junctions of transistors Q1 and Q2 (the output of filter input gain path) and the collector junctions of transistors Q3 and Q4 (output of the ALPHA signal attenuation path) in a cross-coupling configuration as shown. In this embodiment, prior to the summing, the ALPHA signal is effectively inverted by the reversed collector wiring to create the negative preattenuator feedback loop.

Transistors Q5 and Q6 are emitter follower buffers which buffer the preattenuator summing circuit (multiple sets of emitter followers may also be used) to drive the drive the input signal of BIQ1 102 and feedforward amplifier 101 of FIG. 4. The response time of the preattenuator is much faster than other transients in the channel, on the order of 20–40 nanoseconds. The preattenuator thus provides a substantially instantaneous response to gain boost changes that otherwise must be handled by the AGC circuit.

Figure 8:
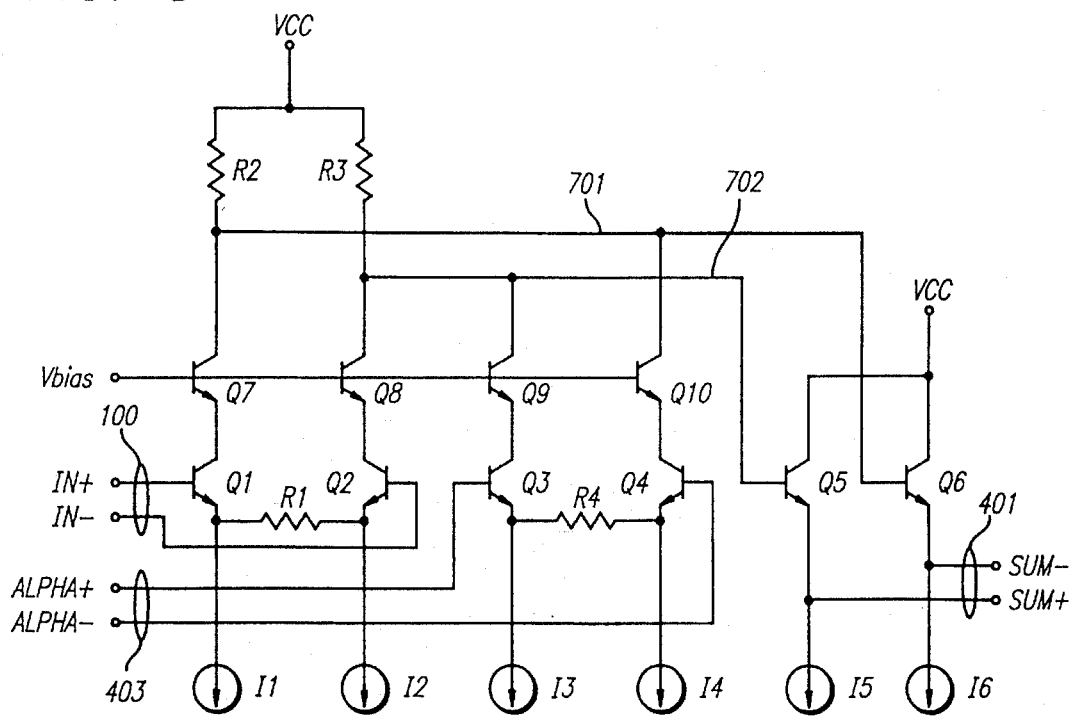
FIG. 8 is a circuit diagram of an alternate embodiment of the feedback circuit used to implement the filter boost preattenuator of the present invention.
Figure 9:
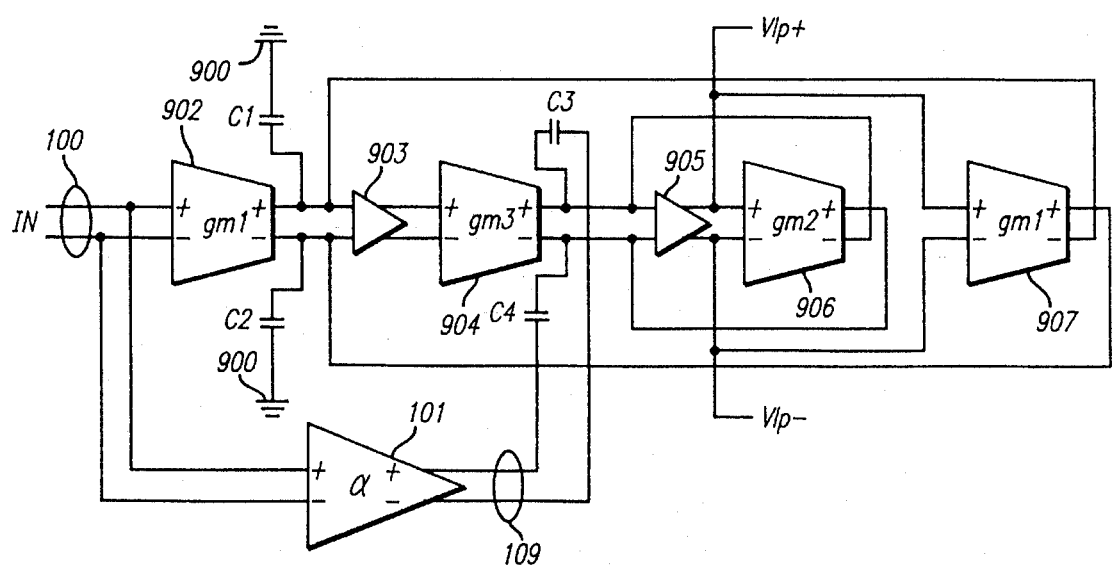
FIG. 9 is a circuit block diagram of a prior art differential biquad circuit with high frequency boost.

FIG. 8 shows an alternate embodiment of the transistor circuit shown in FIG. 7. In FIG. 8, a cascode design is used to provide increased bandwidth. As with the previous figure, system input 100 comprises IN+ and IN− signals coupled to the base junctions of transistors Q1 and Q2, respectively. Feedforward signal 403 comprises ALPHA+ and ALPHA− signals coupled to the base junctions of transistors Q3 and Q4, respectively. The summed signal 401 comprises SUM+ and SUM− signals coupled to the emitter junctions of transistors Q5 and Q6, respectively.

Resistor R1 is coupled between the emitter junctions of transistors Q1 and Q2. The emitter junctions of transistors Q1 and Q2 are further coupled to current sources I1 and I2, respectively. Resistor R4 is coupled between the emitter junctions of transistors Q3 and Q4. The emitter junctions of transistors Q3 and Q4 are further coupled to current sources I3 and I4, respectively. The emitter junctions of transistors Q5 and Q6 are coupled to current sources I5 and I6, respectively. The collector junction of transistor Q1 is coupled to the emitter junction of transistor Q7. The collector junction of transistor Q2 is coupled to the emitter junction of transistor Q8. The collector junction of transistor Q3 is coupled to the emitter junction of transistor Q9. The collector junction of transistor Q4 is coupled to the emitter junction of transistor Q10. The base junctions of transistors Q7–Q10 are coupled to a bias voltage, Vbias.

The collector junctions of transistors Q7 and Q10, and the base junction of transistor Q6, are coupled to node 701. Node 701 is further coupled through resistor R2 to VCC. The collector junctions of transistors Q8 and Q9, and the base junction of transistor Q5, are coupled to node 702. Node 702 is further coupled through resistor R3 to VCC. The collector junctions of transistors Q5 and Q6 are coupled to VCC.

This embodiment operates as the circuit in FIG. 7, but includes the advantages offered by a cascode configuration, i.e. decreased Miller effect in the input transistors, and the high bandwidth and reverse transmission isolation provided by the common-base stage.

Figure 10:
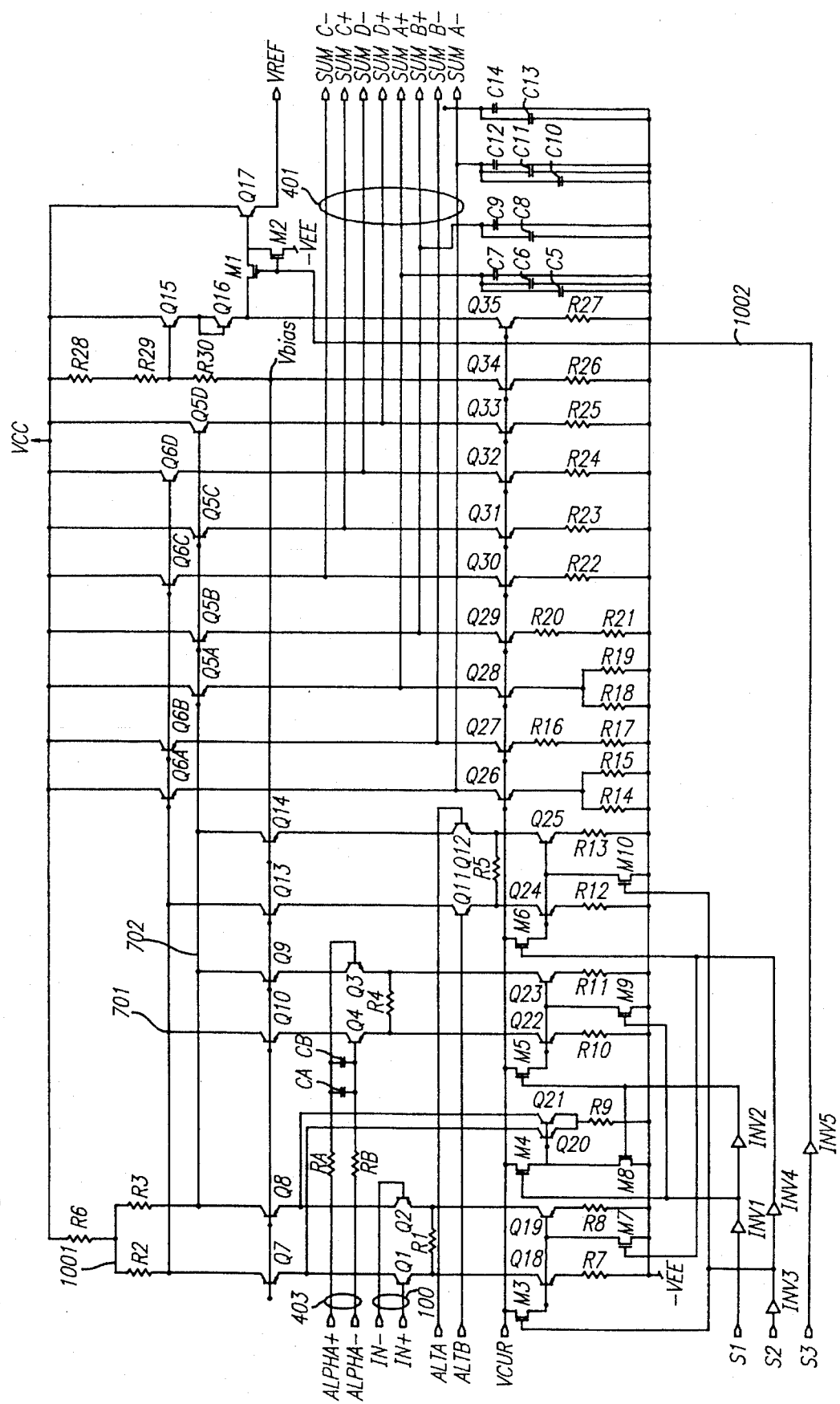
FIG. 10 is a circuit diagram of one implementation of one embodiment of the present invention.

FIG. 10 shows an implementation of the cascode embodiment of the present invention described with respect to FIG. 8. The value of Kfb for this figure is 0.19, though, as stated above, this value can vary depending on the particular embodiment. In the embodiment illustrated in FIG. 10, transistors Q1–Q35 are NPN bipolar transistors. Transistor M1 is a P-channel MOSFET. Transistors M2–M10 are N-channel MOSFETS. The MOSFET transistors act primarily as switches within the circuit. Transistors Q18–Q35 act as current sources.

IN signal 100 consists of signal IN+ and signal IN− coupled to the base junctions of transistors Q1 and Q2 respectively. Resistor R1 is coupled across the emitter junctions of transistors Q1 and Q2. To form a cascode configuration, the collectors junctions of transistors Q1 and Q2 are coupled to the emitter junctions of transistors Q7 and Q8 respectively. The collector junctions of transistors Q7 and Q8 are coupled to summing nodes 701 and 702 respectively. Resistors R2 and R3 are coupled between node 1001 and nodes 701 and 702 respectively. Resistor R6 is coupled between node 1001 and the positive voltage supply VCC. ALPHA signal 403 consists of ALPHA+ and ALPHA− signals. ALPHA+ is coupled through input resistor RA to the base junction of transistor Q3. ALPHA− is coupled through input resistor RB to the base junction of transistor Q4. Capacitors CA and CB are coupled across the base junctions of transistors Q3 and Q4. Resistor R4 is coupled across the emitter junctions of transistors Q3 and Q4. The collector junctions of transistors Q3 and Q4 are coupled to the emitter junctions of transistors Q9 and Q10, respectively, in a cascode configuration. The collector junctions of transistors Q9 and Q10 are coupled to summing nodes 702 and 701 respectively.

Input signals ALTA and ALTB are coupled to the base junctions of transistors Q12 and Q11 respectively. Resistor R5 is coupled across the emitter junctions of transistors Q11 and Q12. The collector junctions of transistors Q11 and Q12 are coupled to the emitter junctions of transistors Q13 and Q14, respectively, to provide a cascode configuration. The collector junctions of transistors Q13 and Q14 are coupled to summing nodes 701 and 702 respectively. The base junctions of transistors Q6A–Q6D are coupled to summing node 701. The base junctions of transistors Q5A–Q5D are coupled to summing node 702. The collector junctions of transistors Q5A–Q5D and Q6A–Q6D are coupled to VCC. The emitter junctions of transistors Q5A and Q6A provide output signals SUMA+ and SUMA− respectively. The emitter junctions of transistors Q5B and Q6B provide output signals SUMB+ and SUMB− respectively. The emitter junctions of transistors Q5C and Q6C provide output signals SUMC+ and SUMC− respectively. The emitter junctions of transistors Q5D and Q6D provide output signals SUMD+ and SUMD− respectively. Differential output signal SUMA comprises output signals SUMA+ and SUMA−. Differential output signals SUMB, SUMC and SUMD are comprised similarly of signals SUMB+ and SUMB−, SUMC+ and SUMC−, and SUMD+ and SUMD−, respectively.

Resistors R28 and R29 are coupled in series between the base junctions of transistor Q15 and voltage supply VCC. Resistor R30 is coupled between the base junction of transistor Q15 and node Vbias. Vbias is provided to the base junctions of transistors Q7–Q10, Q13 and Q14. The collector junction of transistor Q15 is coupled to VCC. The collector and base junctions of transistor Q16 are coupled to the emitter junction of transistor Q15. The emitter junction of transistor Q16 is coupled to the source of P-channel MOSFET M1. The drain of P-channel MOSFET M1 is coupled to the drain of N-channel MOSFET M2 and the base junction of transistor Q17. The source of N-channel MOSFET M2 is coupled to voltage supply −VEE. The collector junction of transistor Q17 is coupled to VCC. The emitter junction of transistor Q17 is provided as DC bias output, VREF, for other DC bias applications in the filter. The gates of MOSFETS M1 and M2 are coupled to node 1002.

The emitter junctions of transistors Q1 and Q2 are coupled to the collector junctions of transistors Q18 and Q19 respectively. The emitter junctions of transistors Q18 and Q19 are coupled through resistors R7 and R8, respectively, to voltage source −VEE. The emitter junctions of Q7 and Q8 are coupled to the collector junctions of transistors Q20 and Q21 respectively. The emitter junctions of transistors Q20 and Q21 are coupled through resistor R9 to voltage source −VEE. The emitter junctions of transistors Q3 and Q4 are coupled to the collector junctions of transistors Q23 and Q22 respectively. The emitter junctions of transistors Q22 and Q23 are coupled through resistors R10 and R11, respectively, to voltage source −VEE. The emitter junctions of transistors Q11 and Q12 are coupled to the collector junctions of transistors Q24 and Q25 respectively. The emitter junctions of transistors Q24 and Q25 are coupled through resistors R12 and R13, respectively, to voltage source −VEE.

The emitter junctions of transistors Q6A, Q6B, Q5A, Q5B, Q6C, Q5C, Q6D, Q5D, and Q16 are coupled to the collector junctions of transistors Q26–Q35 respectively. Resistors R14 and R15 are coupled in parallel between the emitter junction of transistor Q26 and voltage source −VEE. Resistors R16 and R17 are coupled in series between the emitter junction of transistor Q27 and −VEE. Resistors R18 and R19 are coupled in parallel between the emitter junction of transistor Q28 and −VEE. Resistors R20 and R21 are coupled in series between the emitter junction of transistors Q29 and −VEE. Resistors R22–R27 are coupled individually between the emitter junctions of transistors Q30–Q35, respectively, and −VEE. Capacitors C5–C7 are coupled in parallel between output node SUMA+ and −VEE. Capacitors C8 and C9 are coupled in parallel between output node SUMB+ and −VEE. Capacitors C10–C12 are coupled in parallel between output node SUMA− and −VEE. Capacitors C13 and C14 are coupled in parallel between output node SUMB− and −VEE.

Input reference voltage VCUR is provided to the base junctions of transistors Q26–Q35 and the drains of MOSFETS M3–M6. The source of MOSFET M3 is coupled to the base junctions of transistors Q18 and Q19. The source of MOSFET M4 is coupled is the base junctions of transistors Q20 and Q21. The source of MOSFET M5 is coupled to the base junctions of transistors Q22 and Q23. The source of MOSFET M6 is coupled to the base junctions of transistors Q24 and Q25. MOSFET M7 is coupled between the source of MOSFET M3 and −VEE. MOSFET M8 is coupled between the source of MOSFET M4 and −VEE. MOSFET M9 is coupled between the source of MOSFET M5 and −VEE. MOSFET M10 is coupled between the source of MOSFET M6 and −VEE.

Control signals S1–S3 are provided to the inputs of inverters INV1, INV3 and INV5, respectively. The output of inverter INV1 is coupled to the input of inverter INV2 and to the gates of MOSFETS M4 and M9. The output of inverter INV2 is coupled to the gates of MOSFETS M5 and M8. The output of inverter INV3 is coupled to the input of inverter INV4 and to the gates of MOSFETS M3 and M10. The output of inverter INV4 is coupled to the gates of MOSFETS M6 and M7. The output of inverter INV5 is coupled to node 1002.

Differential output signal SUMC of FIG. 10 is the output of the summing circuit corresponding to the SUM+ and SUM− outputs of the circuit of FIG. 8, and further corresponding to signal 401 in FIG. 4. SUMA, SUMB and SUMD are also behaviorally the same signal as SUMC, but are provided to other locations as follows. SUMA and SUMB of FIG. 10 are two substantially identical but separately buffered versions of signal SUMC with uneven emitter follower transistor sizes. Specifically, Q5B and Q6B are approximately four times the size of Q5A and Q6A. SUMA and SUMB are provided to the Gm element 110 from node 401 in FIG. 4 to be used in a distortion reduction circuit in the biquadratic section. SUMD of FIG. 10 is similar to SUMC. SUMD is provided to another variable gain feed-forward section of the filter to be utilized in adjustment of the filter's group delay. The invention may be practiced without the distortion reduction circuitry and the group delay adjustment scheme of FIG. 10, though the embodiment of FIG. 10 provides means for generating appropriate signals if desired.

Signal S3 is a power conserving enable line for the reference generating circuit of M1–2 and Q15–17. When S3 is logically high, M1 is conducting, and M2 is an open circuit. The emitter of Q17 is therefore active. When S3 is low in the powerdown mode (during which VCUR is also shut down to turn off all circuits connected to it in FIG. 10), M2 reverse biases Q17, shutting off the emitter current to conserve power.

MOSFETs M5 and M9 allow the boost preattenuation to be selectively disabled by shutting off the ALPHA input path. This is accomplished by driving S1 low, turning off M5 and turning on M9 to short the base junctions of Q22 and Q23 to −VEE. Transistors Q22 and Q23 are thus disabled, removing the necessary emitter drive current from input transistors Q3 and Q4. MOSFETs M4 and M8 enable transistors Q20 and Q21 when Q3, Q4, Q22 and Q23 of the ALPHA input path are turned off. Transistors Q20 and Q21 maintain a consistent common mode DC bias voltage at the collectors of Q7 and Q8 and subsequently all of the outputs SUMA–D to maintain adequate voltage headroom for signal swings.

Switches M6 and M10 turn on Q11 and Q12 of the ALTA/B input path by turning on Q24 and Q25 when S2 is high. This permits a special calibration signal to be input to the filter for calibrating the cutoff frequency of the filter. When this calibration input is enabled, the normal signal input path IN± at Q1 and Q2 is disabled by shutting off Q18 and Q19 via switches M3 and M7 when S2 is high. Otherwise, when S2 is low, the normal input IN± is enabled, and the special calibration input at ALTA/B is disabled. However, the invention may be practiced without the calibration feature set forth in this embodiment.

Capacitors CA and CB, in combination with resistors RA and RB, while not required to practice the present invention, provide additional feedback loop compensation by filtering signals at very high frequencies beyond the filter's preset bandwidth. Capacitors C5–C14 provide additional group delay in the output paths of SUMA and SUMB relative to SUMC and SUMD for time delay matching of their respective subsequent signal paths into the following biquad stage. SUMC and SUMD are subject to additional delays related to the feedforward boost and group delay adjustment variable gain stages prior to going to the first biquad, whereas SUMA and SUMB are provided directly to the first biquad. Therefore, SUMA and SUMB are provided with some additional delay to match the time delay in the SUMC and SUMD paths.

Thus, a filter boost preattenuator has been described.

I claim:

1. A circuit comprising:

a filter having first and second filter inputs and a filter output;

first amplifier having a first amplifier input and a first amplifier output, said first amplifier output coupled to said first filter input;

second amplifier having a second amplifier input and a second amplifier output, said second amplifier input coupled to said first amplifier output;

summing means having first and second summing inputs and a summing output, said first summing input receiving an input signal, said second summing input coupled to said second amplifier output, said summing output coupled to said first amplifier input and said second filter input.

2. The circuit of claim 1 wherein said first filter input is AC coupled to an internal summing node to provide high frequency gain boost to said filter.

3. The circuit of claim 1 wherein said filter comprises at least one biquad section.

4. The circuit of claim 3 wherein said filter comprises a multi-order filter comprising a plurality of cascaded biquads, a first one of said cascaded biquads receiving said first and second filter inputs.

5. The circuit of claim 1 wherein said first amplifier provides a controllable gain boost.

6. The circuit of claim 5 wherein said second amplifier provides negative feedback with a gain value such that:

summing output=input signal/(1+(gain boost)(gain value))

7. The circuit of claim 6 wherein said gain value is less than 0.25.

8. The circuit of claim 1 wherein said second amplifier and said summing means comprise differential transistor pair-based amplifiers with wired collectors.

9. The circuit of claim 8 wherein said differential transistor pair-based amplifiers comprise cascoded transistors.

10. The circuit of claim 8 wherein said wired collectors are followed by at least one emitter follower configuration.

11. The circuit of claim 8 wherein a gain value of said second amplifier is dependent upon emitter and collector resistors in said differential transistor pair-based amplifiers.

12. The circuit of claim 1 wherein signal propagation through said first and second amplifiers is substantially instantaneous with respect to a frequency range of interest.

13. The circuit of claim 1 wherein said first amplifier comprises:
    first means for providing said first amplifier output to said first filter input; and
    second means for providing said first amplifier output to said second amplifier input.

14. A method for preattenuating an input signal for a filter having a selected frequency range gain boost, said method comprising the steps of:
    providing a feedforward boost signal from a boost element to a feedforward input of said filter;
    tapping said feedforward boost signal from said boost element to provide a tapped signal;
    multiplying said tapped signal by a feedback factor to provide a feedback signal;
    subtracting said feedback signal from said input signal to provide an attenuated input signal;
    providing said attenuated input signal to a first input of said filter and to said boost element.

15. The method of claim 14 wherein said step of tapping said feedforward boost signal occurs prior to AC coupling of said feedforward boost signal to said filter.

16. The method of claim 14 wherein said step of multiplying said tapped signal comprises providing said tapped signal to a differential transistor pair-based amplifier.

17. The method of claim 14 wherein said step of subtracting said feedback signal from said input signal comprises the step of cross-coupling collectors of differential transistor pairs to perform a wired-collector summation of signals.

18. The method of claim 17 wherein said step of subtracting said feedback signal from said input signal further comprises the step of coupling said wired collectors to at least one emitter follower.

19. A circuit comprising:
    a filter having first and second filter inputs and a filter output, said first filter input AC coupled to an internal summing node to provide high frequency gain boost to said filter, said filter comprising a multi-order filter further comprising a plurality of cascaded biquads, a first one of said cascaded biquads receiving said first and second filter inputs;
    first amplifier having a first amplifier input and a first amplifier output, said first amplifier output coupled to said first filter input, said first amplifier providing a controllable gain boost;
    second amplifier having a second amplifier input and a second amplifier output, said second amplifier input coupled to said first amplifier output, signal propagation through said first and second amplifiers being substantially instantaneous with respect to a frequency range of interest;
    summing means having first and second summing inputs and a summing output, said first summing input receiving an input signal, said second summing input coupled to said second amplifier output, said summing output coupled to said first amplifier input and said second filter input;
    said second amplifier providing negative feedback with a gain value such that:

summing output=input signal/(1+(gain boost)(gain value))

wherein said gain value is less than 0.25; and
    said second amplifier and said summing means comprising differential transistor pair-based amplifiers in a cascode configuration with wired collectors, said wired collectors followed by at least one emitter follower circuit, said gain value of said second amplifier dependent upon emitter and collector resistors in said differential transistor pair-based amplifiers.

20. A method for preattenuating an input signal in a filter having a selected frequency range gain boost, said method comprising the steps of:
    tapping a feedforward boost signal from a boost element to provide a tapped signal, said tapping of said feedforward boost signal occurring prior to AC coupling of said feedforward boost signal to a first input of said filter;
    multiplying said tapped signal by a feedback factor to provide a feedback signal;
    subtracting said feedback signal from said input signal to provide a preattenuated signal;
    providing said preattenuated signal to said boost element and a second input of said filter.

21. A method for preattenuating an input signal to a filter having a first filter input and a second filter input, wherein said second filter input provides a selected frequency range boost signal to said filter, and wherein said preattenuation is provided to said filter for substantially constant gain of said filter about a frequency response pivot point in the presence of changes in a boost gain value of a first amplifier, said method comprising the steps of:
    multiplying an attenuated signal by said boost gain value to generate said boost signal for said second filter input, wherein said boost gain value is varied to provide more than one value of selected frequency boost for said filter;

multiplying said boost signal by a feedback gain value to generate a feedback signal, wherein said pivot point is dependent on said feedback gain value;

subtracting said feedback signal from said input signal to generate said attenuated signal for said first filter input and said first amplifier.

22. The method of claim 21 wherein said boost gain value is varied within the range of zero and five.

23. The method of claim 21 wherein said feedback gain value is within the range of zero to 0.25.

24. The method of claim 21 wherein said pivot point is dependent on a cutoff frequency of said filter.

25. The method of claim 21 wherein said boost signal is AC coupled to said second filter input.

26. The method of claim 21 wherein said step of multiplying said boost signal comprises providing said boost signal to a differential amplifier.

27. The method of claim 21 wherein said step of subtracting said feedback signal from said input signal comprises the step of cross-coupling collectors of differential transistor pairs to perform a wired-collector summation of signals.

28. The method of claim 21 wherein said boost gain value is varied between data and servo operations in a data channel of a disk drive.

29. A circuit comprising:

a filter having first and second inputs, said second input providing filter boost in a selected frequency range, said filter having a cutoff frequency;

a first amplifier receiving an attenuated signal and providing a boost signal to said second filter input, said first amplifier having a variable gain value;

a second amplifier receiving said boost signal and providing a feedback signal, said second amplifier having a feedback gain value;

a summing circuit receiving said feedback signal and subtracting said feedback signal from an input signal to generate said attenuated signal, said attenuated signal provided to said first input and said first amplifier;

wherein a magnitude response curve of said filter pivots about a pivot point frequency in response to variations in said variable gain value, said pivot point frequency dependent on said feedback gain value and said cutoff frequency.

30. The circuit of claim 29 wherein said variable gain value is varied within the range of zero to five.

31. The circuit of claim 30 wherein said feedback gain value is within the range of zero to 0.25.

32. The circuit of claim 29 wherein said second filter input comprises an AC coupling to an internal summing node of said filter to provide high frequency boost.

33. The circuit of claim 29 wherein said second amplifier comprises a differential amplifier.

34. The circuit of claim 33 wherein said summing circuit comprises cross-coupled collectors of differential transistor pairs.

35. The circuit of claim 29 wherein said variable gain value is varied between data and servo modes in a channel of a disk drive.

36. A method for preattenuating an input signal for a filter having a broadband input and a high frequency boost input, said method comprising the steps of:

varying a boost gain value of a first amplifier coupled to said high frequency boost input to provide at least two different values of high frequency boost to said filter;

preattenuating said input signal to generate an attenuated signal in response to an increase in said boost gain value, said attenuated signal coupled to said first amplifier and said broadband input of said filter;

wherein said preattenuation is provided to said filter for substantially constant filter gain about a frequency response pivot point in the presence of changes in said boost gain value.

* * * * *